(12) United States Patent
Passmore et al.

(10) Patent No.: US 9,407,251 B1
(45) Date of Patent: Aug. 2, 2016

(54) METHOD FOR REWORKABLE PACKAGING OF HIGH SPEED, LOW ELECTRICAL PARASITIC POWER ELECTRONICS MODULES THROUGH GATE DRIVE INTEGRATION

(71) Applicant: Arkansas Power Electronics International, Inc., Fayetteville, AR (US)

(72) Inventors: Brandon Passmore, Fayetteville, AR (US); Zach Cole, Fayetteville, AR (US); Bret Whitaker, Fayetteville, AR (US); Adam Barkley, Springdale, AR (US); Ty McNutt, Farmington, AR (US); Alexander Lostetter, Fayetteville, AR (US)

(73) Assignee: Cree Fayetteville, Inc., Fayetteville, AR (US)

( * ) Notice: Subject to any disclaimer, the term of this patent is extended or adjusted under 35 U.S.C. 154(b) by 413 days.

(21) Appl. No.: 14/100,288

(22) Filed: Dec. 9, 2013

Related U.S. Application Data

(60) Provisional application No. 61/734,624, filed on Dec. 7, 2012.

(51) Int. Cl.
*H03K 17/04* (2006.01)
*H05K 1/02* (2006.01)
*H05K 1/14* (2006.01)

(52) U.S. Cl.
CPC .............. *H03K 17/04* (2013.01); *H05K 1/0243* (2013.01); *H05K 1/144* (2013.01)

(58) Field of Classification Search
CPC ............................. H05K 1/0243; H05K 1/144
USPC .......................................................... 361/743
See application file for complete search history.

(56) References Cited

U.S. PATENT DOCUMENTS

| | | | | |
|---|---|---|---|---|
| 5,297,001 A | * | 3/1994 | Sterling | ................... H01L 23/04 257/717 |
| 6,160,326 A | * | 12/2000 | Iversen | ................. H01L 23/467 257/107 |
| 6,307,755 B1 | | 10/2001 | Williams et al. | ............... 361/813 |
| 6,442,033 B1 | * | 8/2002 | Liu | ........................ H01L 21/563 174/538 |
| 7,687,903 B2 | | 3/2010 | Son et al. | ....................... 257/723 |
| 7,723,846 B2 | * | 5/2010 | Ikawa | ............... H01L 23/49861 257/675 |

(Continued)

OTHER PUBLICATIONS

R.K. Ulrich and W.D. Brown, "Advanced Electronic Packaging," New Jersey: John Wiley & Sons, Inc., 2006, p. 203.

(Continued)

*Primary Examiner* — Ramon M Barrera
(74) *Attorney, Agent, or Firm* — Baker & Hostetler LLP

(57) ABSTRACT

A multichip power module directly connecting the busboard to a printed-circuit board that is attached to the power substrate enabling extremely low loop inductance for extreme environments such as high temperature operation. Wire bond interconnections are taught from the power die directly to the busboard further enabling enable low parasitic interconnections. Integration of on-board high frequency bus capacitors provide extremely low loop inductance. An extreme environment gate driver board allows close physical proximity of gate driver and power stage to reduce overall volume and reduce impedance in the control circuit. Parallel spring-loaded pin gate driver PCB connections allows a reliable and reworkable power module to gate driver interconnections.

4 Claims, 4 Drawing Sheets

(56) References Cited

U.S. PATENT DOCUMENTS

| | | | |
|---|---|---|---|
| 7,786,486 B2 | 8/2010 | Casey et al. | 257/76 |
| 8,018,056 B2 | 9/2011 | Hauenstein | 257/730 |
| 8,368,210 B2 | 2/2013 | Hauenstein | 257/724 |
| 2008/0205008 A1* | 8/2008 | Sun | H01L 25/16 361/736 |
| 2012/0101540 A1* | 4/2012 | O'Brien | A61B 5/0031 607/9 |

OTHER PUBLICATIONS

Shengnan Li, "Packaging Design of IGPT Power Module Using Novel Switching Cells," Ph.D. dissertation, University of Tennessee, 2011, http://trace.tennessee.edu/utk_graddis/1205.

* cited by examiner

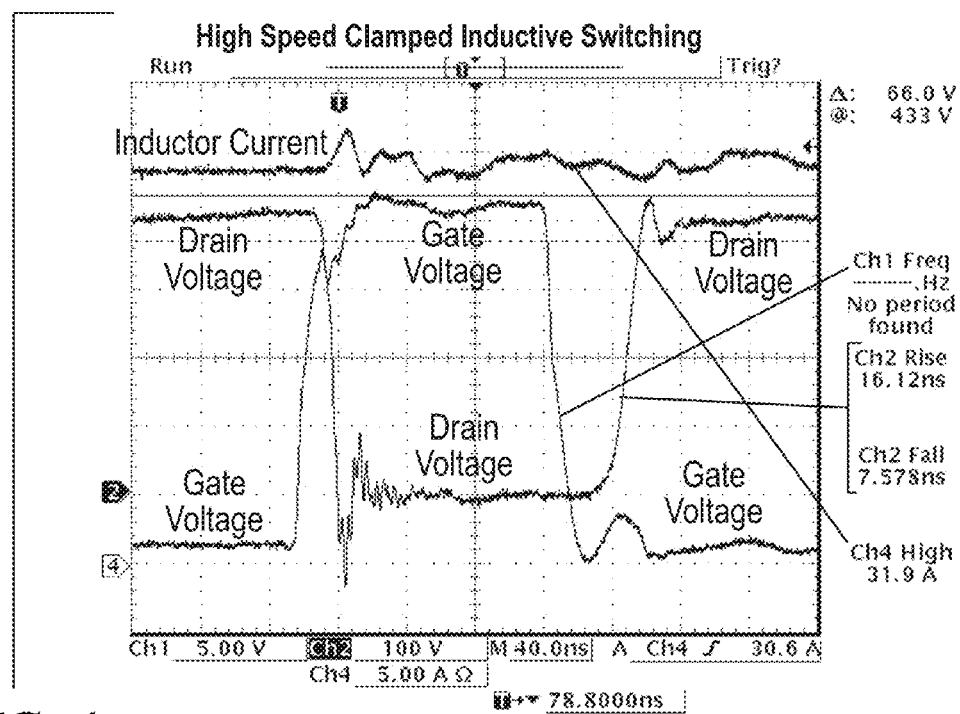
FIG. 4
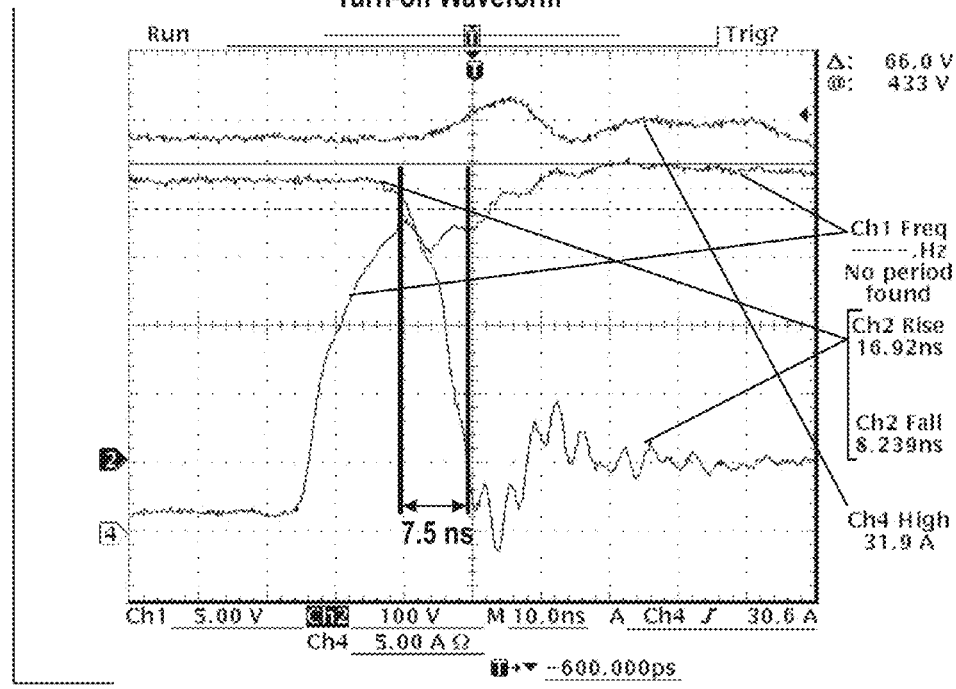

METHOD FOR REWORKABLE PACKAGING OF HIGH SPEED, LOW ELECTRICAL PARASITIC POWER ELECTRONICS MODULES THROUGH GATE DRIVE INTEGRATION

CROSS-REFERENCE TO RELATED APPLICATIONS

This application claims priority of U.S. Patent Application 61/734,624, filed Dec. 7, 2012 entitled A METHOD FOR REWORKABLE PACKAGING OF HIGH SPEED, LOW ELECTRICAL PARASITIC POWER ELECTRONICS MODULES THROUGH GATE DRIVE INTEGRATION, which is hereby incorporated by reference in its entirety.

STATEMENT REGARDING FEDERALLY SPONSORED RESEARCH OR DEVELOPMENT

This invention was made with government support under grant DE-AR0000111 awarded by the United States Department of Energy. The United States government has certain rights in the invention.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in full bridge multi chip power modules with capabilities above 200 degrees Celsius and above 100,000 Hertz operation. More particularly, the invention relates to improvements including an integrated low-parasitic gate driver board. A low-parasitic MCPM design which enables fast switching speeds is critical for present and next-generation high frequency, high power switching power conversion systems that are dominated by switching losses.

2. Description of the Known Art

As will be appreciated by those skilled in the art, power modules are known in various forms. Power modules or packages are known in various forms. Patents include U.S. Pat. No. 7,687,903, issued to Son, et al. on Mar. 30, 2010 entitled Power module and method of fabricating the same; U.S. Pat. No. 7,786,486 issued to Casey, et al. on Aug. 31, 2010 entitled Double-sided package for power module; U.S. Pat. No. 8,018,056 issued to Hauenstein on Sep. 13, 2011 entitled Package for high power density devices; U.S. Pat. No. 8,368,210 issued to Hauenstein on Feb. 5, 2013 entitled Wafer scale package for high power devices; U.S. Pat. No. 6,307,755 issued to Williams, et al. on Oct. 23, 2001 entitled Surface mount semiconductor package, die-leadframe combination and leadframe therefore and method of mounting leadframes to surfaces of semiconductor die. Additional articles include: R. K. Ulrich and W. D. Brown, "Advanced Electronic Packaging," New Jersey: John Wiley & Sons, Inc., 2006, p. 203; and Shengnan Li, "Packaging Design of IGBT Power Module Using Novel Switching Cells," Ph.D. dissertation, University of Tennessee, 2011, http://trace.tennessee.edu/utk_graddiss/1205. Each of these patents and publications are hereby expressly incorporated by reference in their entirety.

From these prior references it may be seen that these prior art patents are very limited in their teaching and utilization, and an improved power module is needed to overcome these limitations.

SUMMARY OF THE INVENTION

The present invention is directed to an improved power module using an integrated printed circuit bus board, onboard capacitors, and close connection gate driver. In accordance with one exemplary embodiment of the present invention, a busboard is directly attached as part of a printed-circuit board, PCB, enabling extremely low loop inductance due to close proximity and parallel length paths. Construction is from extreme environment board materials that allow high temperature operation. Wire bond interconnections are used from the power die to the busboard enable low parasitic interconnections. On-board high frequency bus capacitors provide extremely low loop inductance. Still further, an extreme environment gate driver board allows close physical proximity of gate driver and power stage to reduce overall volume and reduce impedance in the control circuit. A dDual bootstrap/charge pump IC gate drive power supply design is utilized with bare die on the gate driver PCB. A parallel spring-loaded pin gate driver PCB connection allows reliable and reworkable power module to gate driver interconnections. A gate driver/power switch low inductance coupling is provided through PCB & power substrate layout. Voltage and current are scalable based on the power device. This configuration can be implemented with multiple power topology capability, half-bridge, H-bridge, etc. Finally, no mechanical sidewall structures are necessary to hold parts in their physical configuration, because the present invention teaches using bolts for side loads and compressive force and that electrical connectors can double as structural support to maintain gate driver board height.

These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views:

FIG. 4 shows 400 V/30 A switching waveforms of a high frequency MCPM and on the right side provides a magnified image of the turn on waveform showing a 7.5 ns transition time.

DETAILED DESCRIPTION OF THE INVENTION

Figure 1:
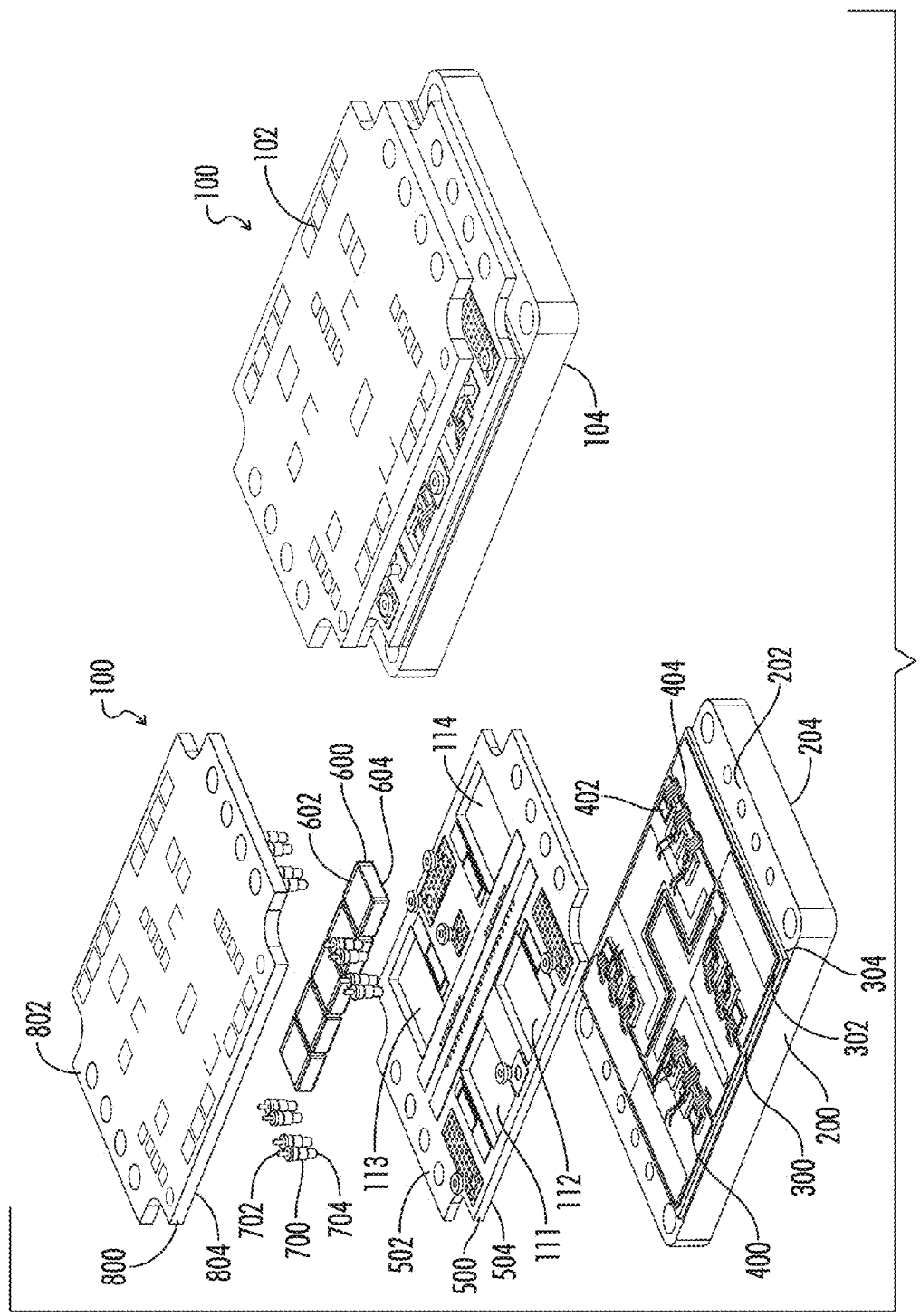
FIG. 1 includes on the left side an exploded view of the high temperature, high frequency MCPM with an integrated gate driver, and on the right side an assembled view of the integrated components.

As shown on the right side of FIG. 1 of the drawings, one exemplary embodiment of the present invention is generally shown as a multi chip power module MCPM 100 with dimensions of only 2.3 inch length, 1.6 inch width, and 0.46 inch height. The MCPM 100 includes a module top 102 and module bottom 104. As shown in the exploded view on the left side, the multi chip power module 100 consists of a baseplate 200, power substrate 300, power die 400, integrated busboard or printed circuit board, PCB, 500, high frequency capacitors 600, pogo pin gate driver/busboard interconnections 700, and gate driver board 800 as shown in FIG. 1. The gate driver 102 was designed to control each of the four independent full-bridge switch positions 111, 112, 113, 114. The key features and highlights of this invention include: High temperature capability, >200° C.; High switching frequency capability, >100 kHz; High voltage/current capability; Extremely low-parasitic packaging design; Rugged and reworkable assembly process; Compact, low-profile package; and Integrated gate drive solution.

The baseplate 200 is comprised of a base metal, i.e., copper, aluminum, etc., or an engineered composite metal, i.e., copper tungsten, copper moly, aluminum graphite, aluminum beryllium, etc., depending on the application and service temperature. The baseplate 200 includes a base top 202 and base bottom 204. Base metals offer the highest thermal conductivity, but have a high coefficient of thermal expansion, CTE, which can cause stress issues at high temperature operation if not carefully accounted for. Engineered metals feature an effective compromise between thermal and mechanical performance, increasing reliability at the tradeoff of a somewhat reduced performance and increased cost. This package is designed to employ a variety of baseplate material options in order to best meet the needs of a given system and operational environment.

The power substrate 300, i.e., direct bond copper, direct bond aluminum, active metal braze, etc., is a bonded ceramic-metal structure. The power substrate 300 includes a substrate top 302 and substrate bottom 304, with the substrate bottom 304 designed to connect to the base top 202. These substrates are capable of carrying very high currents, and are formed with high thermal conductivity engineered ceramics such as aluminum nitride, AlN, and silicon nitride, Si3N4. In addition, bonded ceramic-metal substrates are ideal for high switching frequency applications due to the wide electrically conductive traces. At high frequencies, the skin effect becomes more dominant which exponentially increases the electrical resistance of the current path. Wide traces increase the available surface area which in turn reduces the electrical resistance.

The power die 400 includes a die top 402, and die bottom 404 with connections as known in the art of constructing power die 400 with the die top 402 designed to connect to the busboard 500 and the die bottom 404 designed to connect to the substrate top 302.

The core of the design is based around a multi-layered printed-circuit board busboard, 500 with through connections that is directly attached, i.e., by solder, epoxy, etc., to the power substrate 300 which allows for easy routing of the power device gate and source Kelvin connections to the gate driver board 800. The integrated busboard printed circuit board 500 includes an integrated busboard top 502 and integrated busboard bottom 504 with electrical connections from the top 502 to the bottom 504. This allows the multi-layer busboard 500 to route of the substrate power connections to the top side 502 of the board 500 where busbars can be connected to access the switching nodes of the individual half-bridge legs and the DC bus voltage connections of the full-bridge module. The high frequency capacitors 600 include a capacitor top 602 and capacitor bottom 604 with electrical connections on the bottom 604. The high frequency capacitors 600 are soldered to the busboard 500 with the capacitor bottom 604 soldered to the busboard top 502 such that they are physically and electrically close to the power devices, drastically reducing the critical power path loop inductance when compared to the present state of the art. This is a critical feature in this design which enables fast, low-loss switching transients.

Pogo pin interconnections 700 are used to connect the gate driver board 800 and the busboard 500. The pogo pin gate driver to busboard interconnections 700 include a pin top 702 for connecting the gate driver board 800 and a pin bottom 704 for connecting the busboard 500. These pin interconnections 700 allow a high temperature pressure contact connection while retaining excellent reworkability of the module. Connection pads were designed on the busboard 500 to allow an adequate amount of tolerance to ensure that the pogo pins were in good contact. Additionally, two paralleled pogo pins were used for each electrical connection for two reasons: to provide a level of redundancy and robustness, and to reduce the critical gate loop inductance.

Developed Assembly Process

Solder attach processes were developed for the die 400 attach, power substrate 500 attach, and integrated PCB 500 attach. PbSn, 95:5, ribbon solder was used as a high temperature attach of the power substrate 500 to the baseplate 200. A reflow oven was used to achieve a flux free attach with minimal voiding. A fixture fastened to the baseplate 200 provided alignment as well as a small amount of pressure on the substrate 500. A laser-cut preform comprised of PbSn, 95:5, solder was used as a high temperature attach of the bus board 500 to the substrate 300 as well. AuSn, 80:20, solder preforms were used to attach the power die 400 and diodes to the substrate. Alignment was made using fixtures inserted into cutouts in the integrated bus board 500. Die planarity is ensured by the use of weights added into the fixturing during reflow. It is important to note that the use of fixturing allows for simultaneous attach of the baseplate 200, power substrate 300, busboard 500, and power die 400 to eliminate processing time and steps.

Figure 2:
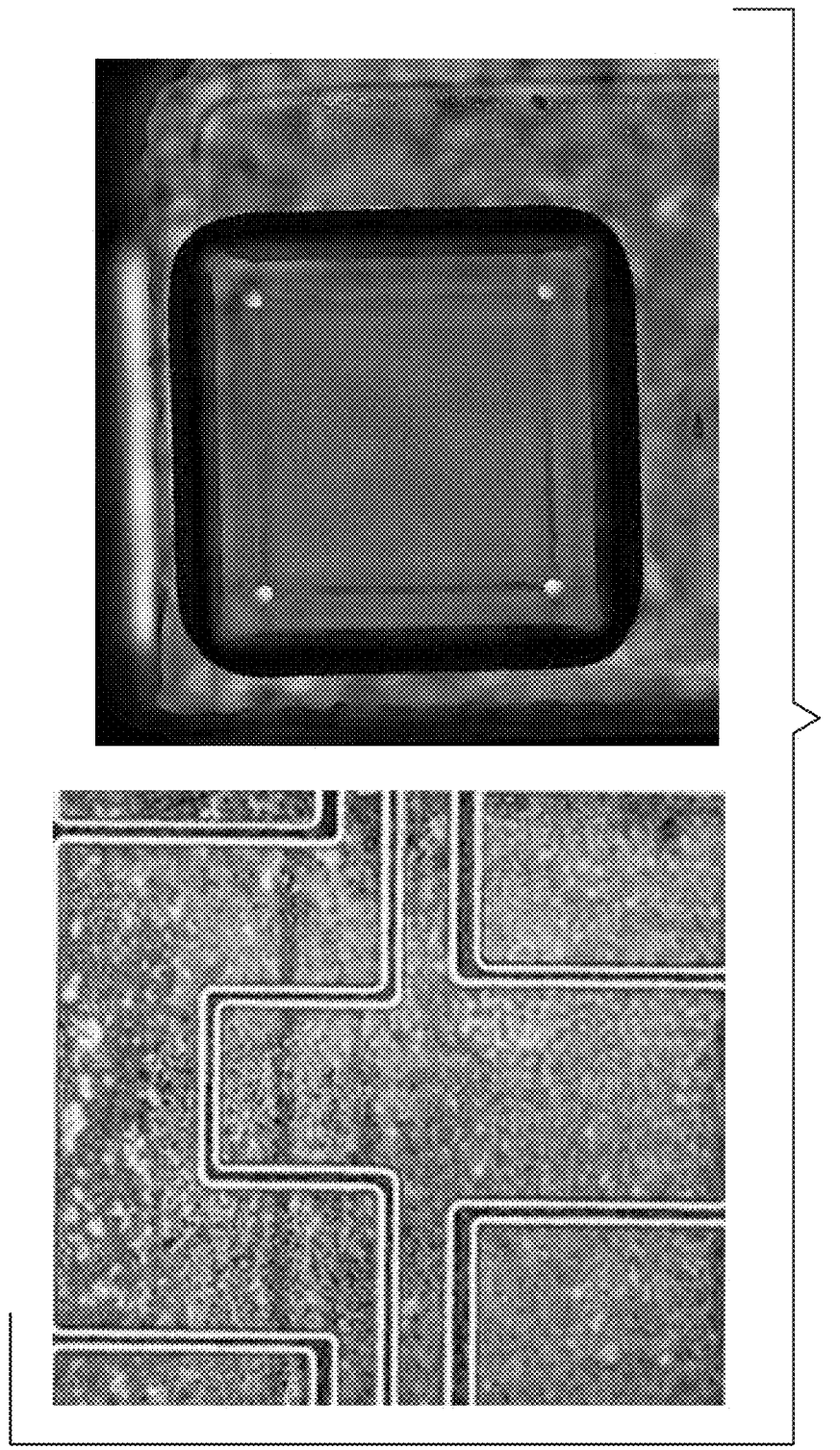
FIG. 2 includes a left image of the power substrate and right image of a die attach with both images showing minimal voiding resulting in a low thermal impedance.

FIG. 2 shows scanning acoustic microscopy, SAM, images of the power substrate 300 and die 400 attach for the demonstrated high frequency power module. Connections from the power devices 400 to the power substrate 300 and busboard 500, gate and Kelvin connections, were made using 5 mil aluminum wirebonds. Each switch position was then individually passivated with a high temperature encapsulant.

Figure 3:
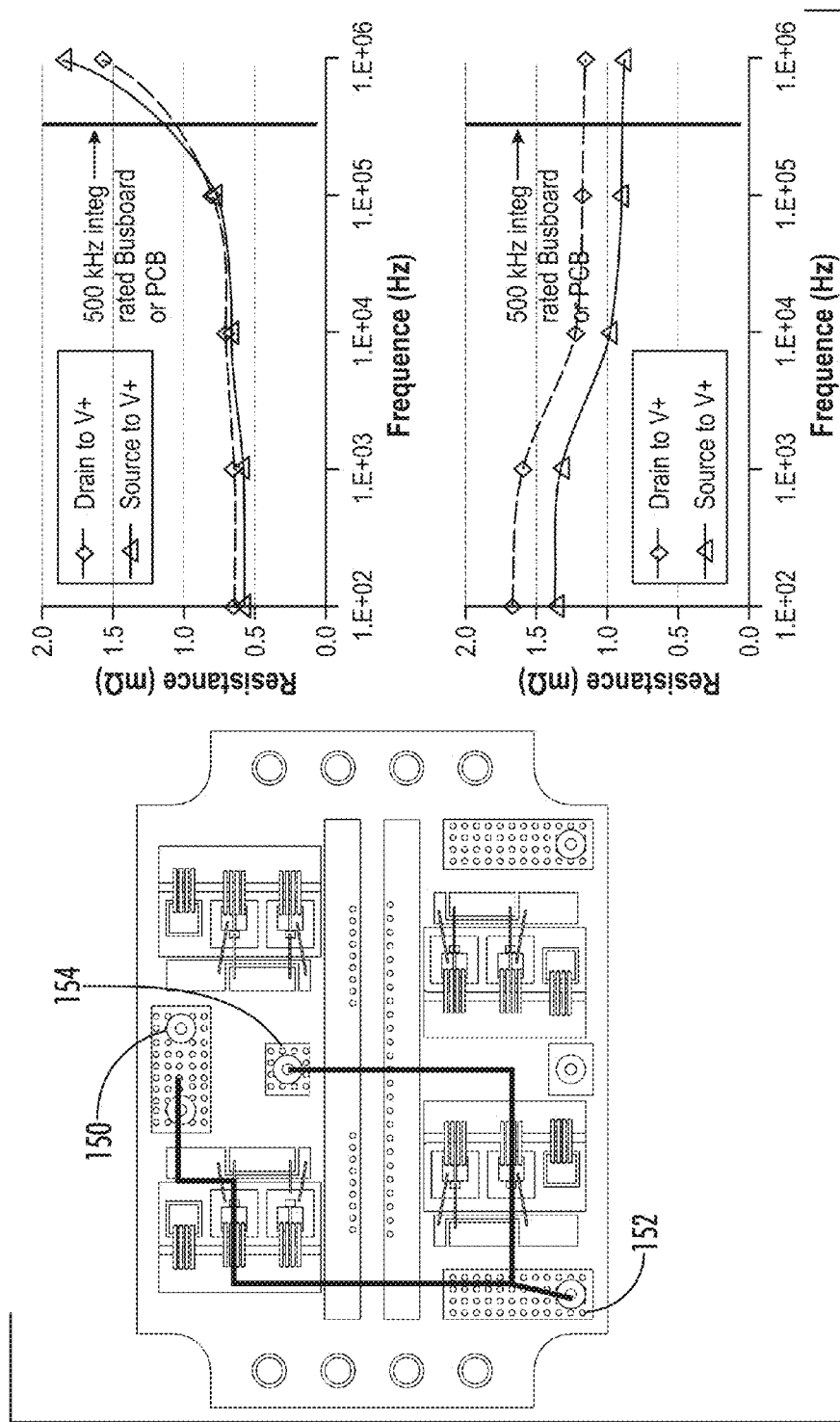
FIG. 3 shows of the left side a schematic of the traces from Drain 150, to V 152, and source 154, to V+ 152 in the MCPM 100 that were modeled to determine the resistances and inductances and on the right side the resistances and inductances of the traces over frequency with a vertical line marking the 500 kHz operational point.

Current paths of interest for circuit analysis are those that connect between nodes of the full bridge. Due to the symmetry inherent in the MCPM layout, the paths from drain or source to either side leg of the full bridge are equal. The simulated parasitic resistances and inductances of these over a range of frequencies are shown in FIG. 3. A power converter producing approximately a 500 kHz square wave also generates higher frequency harmonics which contribute to the impedance. However, their contribution to the net current falls off at a rate of 1/n2, where n is the harmonic number. Therefore, since the resistance increases with frequency at a much lower rate and the inductance actually drops very slowly with frequency, the power loss is dominated by the fundamental switching frequency and the power losses associated with the harmonics are negligible. At 500 kHz, the resistances and inductances were less than 1.2 mΩ) and 12 nH, respectively. As a comparison, the inductance values calculated for the full-bridge module presented here are approximately the same as those found for a proposed 1.5" square packaged low-inductance half-bridge topology, and one-half that of a conventional 1.5" square comparison half-bridge topology. The reduction in parasitics allows for an increase in di/dt corresponding to a reduction in switching losses. Moreover, this also translates into an important reduction of the transient overvoltage condition present across the die during switching transients, by reducing the energy stored in module parasitic inductances prior to switching. This overvoltage reduction improves long-term reliability. It is important to note that typically devices with a voltage blocking capability of 2× the bus voltage are selected to cprovide a sufficient safety and lifetime margin. Furthermore, the on-resistance of majority-carrier devices increases with device blocking capability. As such, a 30% reduction in voltage blocking capability provides a 50% reduction in conduction losses.

Gate Driver Board 800

The gate driver board 800 instantiates a full-bridge gate driver consisting of two independent low-side channels and two independent high-side channels. For all channels, a bare-die 14 A gate driver integrated circuit, IC, was attached and wirebonded to the gate driver board 800 to minimize footprint and maximize density when compared to a conventional plastic packaged part.

A bipolar power supply was created for each channel of the gate driver in order to supply the gate driver ICs which ultimately control the power device gates. The high-side bipolar gate drive power supplies were created using a scheme combining bootstrapping and charge pumping. Two supplies, a low-side referenced 20 V power supply and a low-side referenced 5 V power supply, both referenced to the low-side source connection, charge bootstrap capacitors referenced to their respective half-bridge leg midpoint through silicon carbide, SiC, Schottky diodes. SiC Schottky diodes were chosen due to their low switching loss and related reduced thermal management requirements. These bare-die SiC Schottky diodes were attached and wirebonded to the gate driver board 800, again to increase system density. Next, the newly created floating 5 V power supply is inverted using a flying-capacitor charge pump circuit to create a −5 V rail for the gate driver IC. In this way, the high-side gate driver is supplied with floating +20 V and −5 V power desired for driving SiC power MOSFETs. This scheme provides the bipolar supply voltage needed to reduce power device leakage current at high temperatures and to increase transient noise immunity during switch transitions, rejecting false turn-on events and reducing the likelihood of bridge leg shoot-through. This design is able to achieve these benefits without using isolated switching power supplies and improve density, because there are no isolating magnetics, and reliability when operating with high dv/dt, in contrast with currently available commercial isolated power supplies that fail at this operating point.

Signal isolation was provided by digital data isolators located off of the gate driver board 800 to increase the thermal capability of the complete gate driver board 800, the digital isolators are known to be weak and can easily be located off board. Their isolated power supply is derived from the bootstrapped +5 V rail to the −5 V charge pumped rail and sent off board for ease of integration.

High Speed Switching Tests

Extremely fast turn-on and turn-off times were measured using the developed high frequency SiC MCPM 100. A clamped inductive load was used to perform a switching test representative of a hard-switched power converter. The rise and fall times of the power devices were measured with an isolated voltage probe and oscilloscope. A maximum voltage of 400 V was applied to the clamped inductive load, which was then connected to the drain of a single switch position and returned to the power supply via the source connection of the same single switch position. A maximum turn on current of 30 A was achieved through the adjustment of the gate waveform pulse width and number of repetitions. The switching waveforms are displayed in FIG. 4. Under these conditions, rise and fall times of 16.1 and 7.5 ns were observed, respectively. It is also important to mention that no voltage/current overshoot was observed which would normally contribute to additional losses in the system and an increase in the chance of a switch failure.

Reference numerals used throughout the detailed description and the drawings correspond to the following elements:
multi chip power module 100
module top 102
module bottom 104
first switch position 111
second switch position 112
third switch position 113
fourth switch position 114
Drain 150
Voltage input 152
source 154
baseplate 200
base top 202
base bottom 204
power substrate 300
substrate top 302
substrate bottom 304
power die 400
die top 402
die bottom 404
integrated busboard printed circuit board 500
integrated busboard top 502
integrated busboard bottom 504
high frequency capacitors 600
capacitor top 602
capacitor bottom 604
pogo pin gate driver to busboard interconnections 700
pin top 702
pin bottom 704
gate driver circuit board 800
driver top 802
driver bottom 804

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. A multi chip power module apparatus comprising:
   a baseplate;
   a power substrate soldered directly to the baseplate;
   at least one power die soldered to the power substrate; and
   an integrated multilayer busboard soldered directly to the power substrate.
2. The apparatus of claim 1, further comprising:
   high frequency capacitors soldered to the integrated busboard.
3. The apparatus of claim 1, further comprising:
   a gate driver board; and
   pogo pin gate driver interconnections electrically connecting the busboard to the gate driver board.
4. A multi chip power module apparatus comprising:
   a power substrate;
   an integrated multilayer busboard soldered directly to the power substrate;
   at least one power die; and
   a wirebond electrically connecting the at least one power die to the integrated multilayer busboard.

\* \* \* \* \*